United States Patent
Kim et al.

(10) Patent No.: US 8,305,326 B2
(45) Date of Patent: Nov. 6, 2012

(54) GATE DRIVING CIRCUIT HAVING IMPROVED TOLERANCE TO GATE VOLTAGE RIPPLE AND DISPLAY DEVICE HAVING THE SAME

(75) Inventors: Sung-Man Kim, Seoul (KR);
Hong-Woo Lee, Cheonan-si (KR);
Myung-Koo Hur, Cheonan-si (KR);
Hee-Joon Kim, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 892 days.

(21) Appl. No.: 12/218,814

(22) Filed: Jul. 18, 2008

(65) Prior Publication Data
US 2009/0040203 A1 Feb. 12, 2009

(30) Foreign Application Priority Data
Aug. 6, 2007 (KR) .................. 10-2007-0078578

(51) Int. Cl.
*G09G 3/36* (2006.01)
(52) U.S. Cl. .................................. 345/100
(58) Field of Classification Search .......... 345/87, 345/100, 204
See application file for complete search history.

(56) References Cited

U.S. PATENT DOCUMENTS

| | | | |
|---|---|---|---|
| 2005/0057309 A1* | 3/2005 | Gramegna | 330/292 |
| 2007/0195053 A1* | 8/2007 | Tobita et al. | 345/100 |
| 2008/0012816 A1* | 1/2008 | Moon | 345/100 |

FOREIGN PATENT DOCUMENTS

| | | | |
|---|---|---|---|
| CN | 1681047 A | | 10/2005 |
| CN | 1750073 A | | 3/2006 |
| JP | 60170306 A | * | 9/1985 |
| KR | 10-2005-0079718 | * | 8/2005 |

* cited by examiner

*Primary Examiner* — Chanh Nguyen
*Assistant Examiner* — John Kirkpatrick
(74) *Attorney, Agent, or Firm* — Innovation Counsel LLP

(57) ABSTRACT

A gate driving circuit and a display device having the same, a pull-up unit pulls up a current gate signal by using a first clock signal during a first period of one frame. A pull-up driver coupled to the pull-up unit receives a carry signal from one of the previous stages to turn on the pull-up unit. A pull-up unit receives a gate signal from one of the next stages, discharges the current gate signal to an off voltage level, and turns off the pull-up unit. A holder holds the current gate signal at the voltage level. An inverter turns on/off the holder in response to a first clock signal. A ripple preventer has a source and a gate coupled in common to an output terminal of the pull-up unit and a drain coupled to an input terminal of the inverter, and includes a ripple preventing diode for preventing a ripple from being applied to the inverter.

12 Claims, 6 Drawing Sheets

GATE DRIVING CIRCUIT HAVING IMPROVED TOLERANCE TO GATE VOLTAGE RIPPLE AND DISPLAY DEVICE HAVING THE SAME

CROSS-REFERENCE TO RELATED APPLICATION

This application claims priority to and the benefit of Korean Patent Application No. 10-2007-0078578 filed in the Korean Intellectual Property Office on Aug. 6, 2007, the entire contents of which are incorporated herein by reference.

BACKGROUND OF THE INVENTION (a) Field of the Invention

The present invention relates to a gate driving circuit and a display device having the same. More particularly, the present invention relates to a gate driving circuit for improving high temperature reliability, and a display device having the same.

(b) Description of the Related Art

In general, a liquid crystal display includes a liquid crystal panel having a lower substrate, an upper substrate facing the lower substrate, and a liquid crystal layer formed between the lower substrate and the upper substrate and displaying images.

The liquid crystal panel includes a plurality of gate lines, a plurality of data lines, and a plurality of pixels coupled to the gate lines and the data lines. A gate driving circuit for sequentially outputting a gate signal to the gate lines is formed on the liquid crystal panel through the thin film process.

In general, the gate driving circuit includes a shift register in which a plurality of stages are dependently connected. Each stage includes a plurality of driving transistors so as to output a gate voltage to the corresponding gate line. In detail, the stage has a pull-up transistor being coupled to the gate line and outputting the gate voltage, and the output of the gate voltage is coupled to an input terminal of the next stage and is used to control the drive of the next stage. Also, a holder for holding the gate signal at the off voltage level and an inverter for turning on/off the holder are provided. The inverter coupled to the gate line generates an abnormal output to the holder when the gate line generates noise. Therefore, a distorted signal is generated at the next stage gate signal as well as at the current stage.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a gate driving circuit having advantages of improving reliability and drive margin.

The present invention has been made in another effort to provide a display device having the gate driving circuit.

In one aspect of the present invention, a gate driving circuit includes a plurality of dependently coupled stages each of which includes a pull-up unit, a pull-up driver, a pull-down unit, a holder, an inverter, and a ripple preventer. The pull-up unit pulls up a current gate signal by using a first clock signal during a first period in one frame. The pull-up driver coupled to the pull-up unit receives a carry signal from one of the previous stages and turns on the pull-up unit. The pull-down unit receives a gate signal from one of the next stages, discharges the current gate signal to an off voltage, and turns off the pull-up unit. The holder holds the current gate signal at the off voltage's level. The inverter turns on or off the holder in response to the first clock signal. The ripple preventer has an output terminal coupled to inverter and prevents noise from transmitting to the inverter.

The ripple preventer may include a ripple preventing diode comprised of a transistor having a source and a gate coupled in common to an output terminal of the pull-up unit, and a drain coupled to an input terminal of the inverter, and preventing a ripple from being applied to the inverter.

The gate driving circuit may further include a ripple preventing transistor having a drain coupled to the drain of the ripple preventing diode, a source coupled to an off voltage terminal for applying the off voltage, and a gate coupled to a second clock signal terminal for applying a second clock signal having an opposite phase of the first clock signal.

The pull-up unit may comprise a first pull-up unit and an output terminal of the first pull-up unit is coupled to the current gate line. An output terminal of the first pull-up unit may be coupled to the source terminal and the gate terminal of the ripple preventing diode.

The gate driving circuit may comprise a carry circuit for pulling up a current carry signal by using the first clock signal during the first period and an output terminal of the carry circuit is coupled to the pull-up driver of a next stage. The output terminal of the carry circuit may be coupled to the source terminal and the gate terminal of the ripple preventing diode.

The pull-up unit may further comprise a second pull-up unit and an input terminal of the second pull-up unit is coupled to an input terminal of the first pull-up unit. The output terminal of the second pull-up unit may be coupled to the source terminal and the gate terminal of the ripple preventing diode.

The inverter may further include a first inverter transistor having a drain coupled to a first clock signal terminal for applying the first clock signal, a source coupled to the off voltage terminal, and a gate coupled to the drain of the ripple preventing diode; a second inverter transistor having a gate coupled to the drain of the ripple preventing diode, a source coupled to the off voltage terminal, and a drain coupled to a control terminal of the holder; and a ripple preventing capacitor coupled between the gate and the source of the second inverter transistor.

According to the gate driving circuit and the display device having the same, the ripple preventer prevents the ripple signal being applied to the inverter to improve the noise that occurs because of bad inverter outputs. Further, reliability of the gate driving circuit is increased and display quality is improved.

DETAILED DESCRIPTION OF THE EMBODIMENTS

Figure 1:
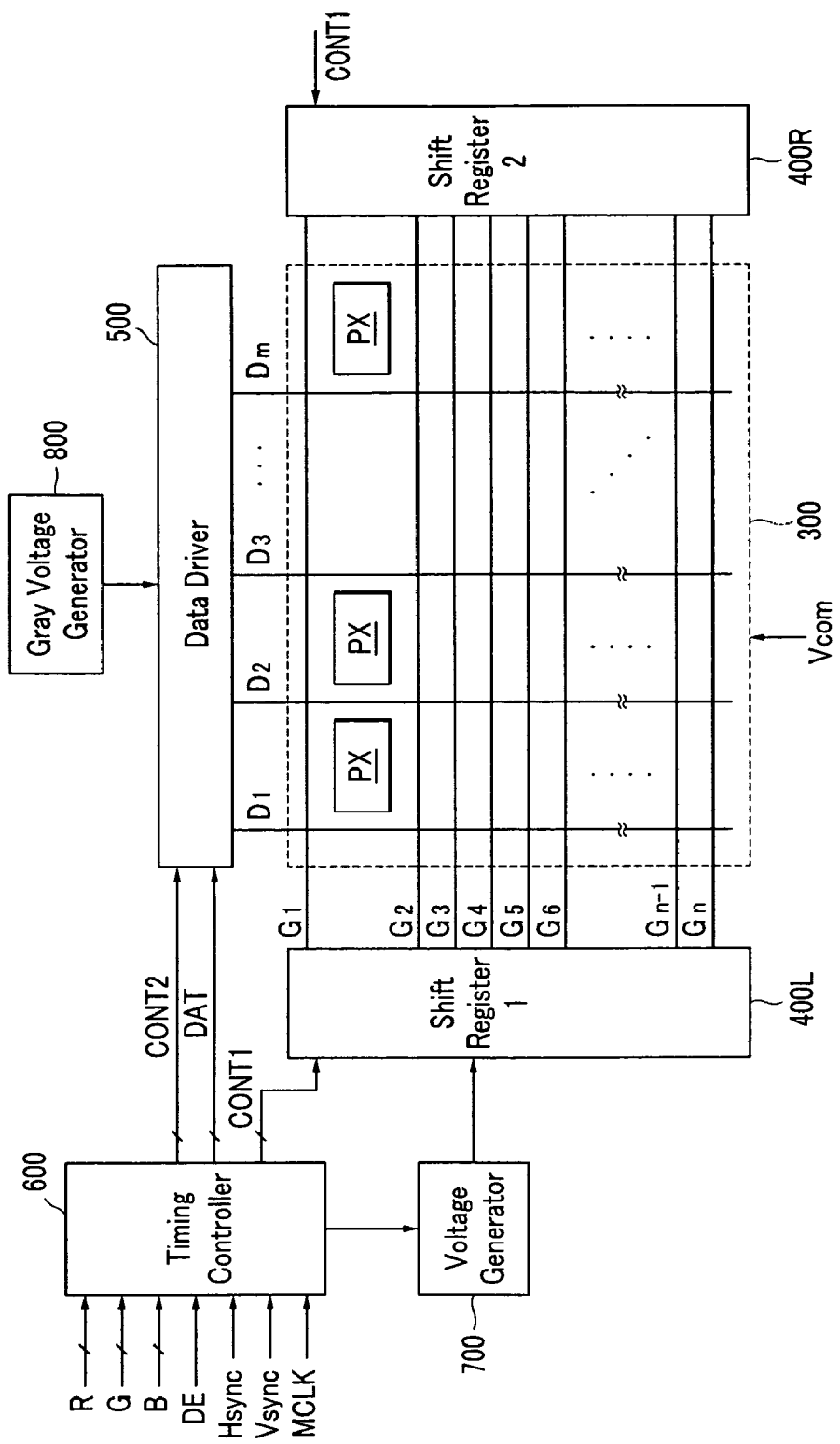
FIG. 1 shows a block diagram of a liquid crystal display according to a first exemplary embodiment of the present invention.

The present invention is described more fully hereinafter with reference to the accompanying drawings, in which exemplary embodiments of the invention are shown. As those skilled in the art realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

Exemplary embodiments of the present invention will now be described in detail with reference to the accompanying drawings.

FIG. 1 shows a block diagram of a liquid crystal display according to a first exemplary embodiment of the present invention.

As shown in FIG. 1, the liquid crystal display includes a liquid crystal panel 300, first and second shift registers 400L and 400R coupled to the liquid crystal panel 300, a data driver 500, a gray voltage generator 800 coupled to the data driver 500, a timing controller 600 for controlling the first and second shift registers 400L and 400R, data driver 500, and gray voltage generator 800 and a voltage generator 700.

The liquid crystal panel 300 includes, as an equivalent circuit, a plurality of display signal lines (G1-Gn and D1-Dm) and a plurality of unit pixels PX arranged in the matrix format and coupled thereto.

Here, the display signal lines (G1-Gn and D1-Dm) include a plurality of gate lines (G1-Gn) for transmitting a gate on signal and a plurality of data lines (D1-Dm) for transmitting a data signal. The gate lines (G1-Gn) are arranged in the row direction and are substantially parallel to each other, and the data lines (D1-Dm) which are arranged in the column direction and are substantially parallel to each other.

The unit pixel PX includes a switch coupled to the display signal lines (G1-Gn and D1-Dm), a liquid crystal capacitor coupled to the switch, and a storage capacitor. The storage capacitor is optional.

If a color display is desired, red, green, and blue color filters along with a switch for each of a red, green and blue color pixels are provided. Also, the color filters are typically formed on the corresponding region of a second display panel, however they may be formed below or above the pixel electrode of the first display panel.

A polarizer (not shown) for polarizing the light is provided on at least one outer surface from among the first display panel and the second display panel of the liquid crystal panel 300.

The gray voltage generator 800 generates two pairs of gray voltages related to the transmittance of the unit pixel. The two gray voltages are a positive voltage and a negative voltage. The positive voltage and the negative voltage have opposite polarities of the data voltages with reference to the common voltage Vcom, and are respectively and alternately applied to the liquid crystal panel in the case of an inversion drive.

The first and second shift registers 400L and 400R which are arranged to a first side and a second side of the liquid crystal panel 300, are coupled to the gate lines (G1-Gn), and apply a gate on signal to the gate lines (G1-Gn).

The data driver 500 which is coupled to the data lines (D1-Dm) of the liquid crystal panel 300, generates a plurality of gray voltages based on the voltage provided by the gray voltage generator 800, selects the generated gray voltage, and applies the gray voltage as a data signal to the unit pixel, and it generally includes a plurality of ICs.

The timing controller 600 generates control signals for controlling the first and second shift registers 400L and 400R and the data driver 500, and provides the corresponding control signals to the first and second shift registers 400L and 400R and the data driver 500.

The voltage generator 700 generates a plurality of driving voltages, including for example, a gate off signal (Voff) and a common voltage Vcom.

A display operation by the liquid crystal display is described below.

The timing controller 600 receives RGB image signals R, G, and B and an input control signal for controlling the RGB image signals from an external graphic controller (not shown), for example, a vertical synchronization signal Vsync, a horizontal synchronizing signal Hsync, a main clock signal MCLK, and a data enable signal DE. The timing controller 600 generates a gate control signal CONT1 and a data control signal CONT2 based on the input control signal, processes the image signals R, G, and B according to the operating condition of the liquid crystal panel 300, provides the gate control signal CONT1 to the first and second shift registers 400L and 400R, and provides the data control signal CONT2 and the processed image data R', G', and B' to the data driver 500.

Here, the gate control signal CONT1 includes first and second start signals (STV1, STV2) for instructing an output start of the gate on signal interval, first and second clock signals (CKV1 and CKV2), first and second inversion clock signals (CKVB1 and CKVB2), and an output enable signal OE for controlling the width of the gate on signal.

The data control signal CONT2 includes a horizontal synchronization start signal STH for instructing an input start of the image data R', G', and B', a data load signal (TP) for applying the corresponding data voltage to the data lines (D1-Dm), an inverting signal RVS for inverting the polarity of the data voltage for the common voltage Vcom (hereinafter, referred to as the polarity of the data voltage), and a data clock signal HCLK.

The data driver 500 sequentially receives image data R', G', and B' corresponding to the unit pixels of one row according to the data control signal CONT2 provided by the timing controller 600, selects the gray voltage corresponding to the respective image data R', G', and B' from among the gray voltages, and thereby converts the image data R', G', and B' into the corresponding data voltages.

The first and second shift registers 400L and 400R apply the gate on signal to the gate lines (G1-Gn) according to the gate control signal CONT1 to turn on the switch coupled to the gate lines (G1-Gn).

When the gate on signal is applied to one of the gate lines (G1-Gn) and the switch of one row coupled to the gate line is turned on (this period is called a "1H" or a "1 horizontal period"), the data driver 500 supplies the data voltages to the corresponding data lines (D1-Dm). The data voltages supplied to the data lines (D1-Dm) are applied to the corresponding unit pixels through the turned-on switch.

The liquid crystal molecules change their arrangements depending on the change of the electric field generated by the pixel electrode and the common electrode, and hence, the polarization of the light passing through the liquid crystal layer is varied. The change of polarization is shown as the change of light transmittance according to the polarizer (not shown) attached to the first display panel and the second display panel.

In a like manner, the gate on signal is sequentially applied to the gate lines (G1-Gn) during one frame to apply the data voltage to the entire unit pixels. When one frame is finished, another frame is started, and the state of the inversion signal RVS applied to the data driver 500 is controlled (frame inversion) so that the polarity of the data voltage applied to the unit pixels may be opposite to the polarity of the previous frame. In this instance, the polarity of the data voltage flowing through one data line may be changed (line inversion) according to the characteristic of the inversion signal RVS within one frame, and the polarities of the data voltages applied to one pixel row may be different (dot inversion).

Figure 2:
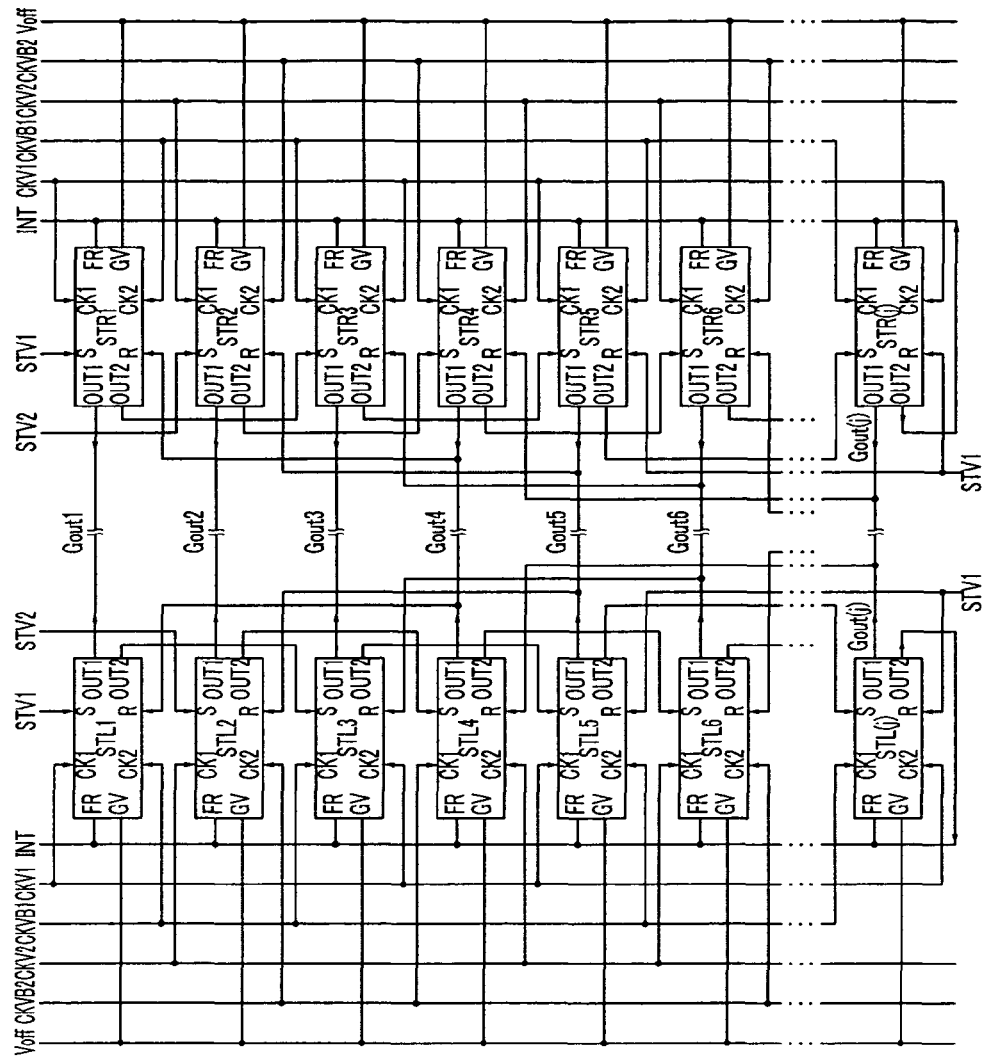
FIG. 2 shows a block diagram of a first shift register and a second shift register used in a gate driving circuit according to a first exemplary embodiment of the present invention.
Figure 3:
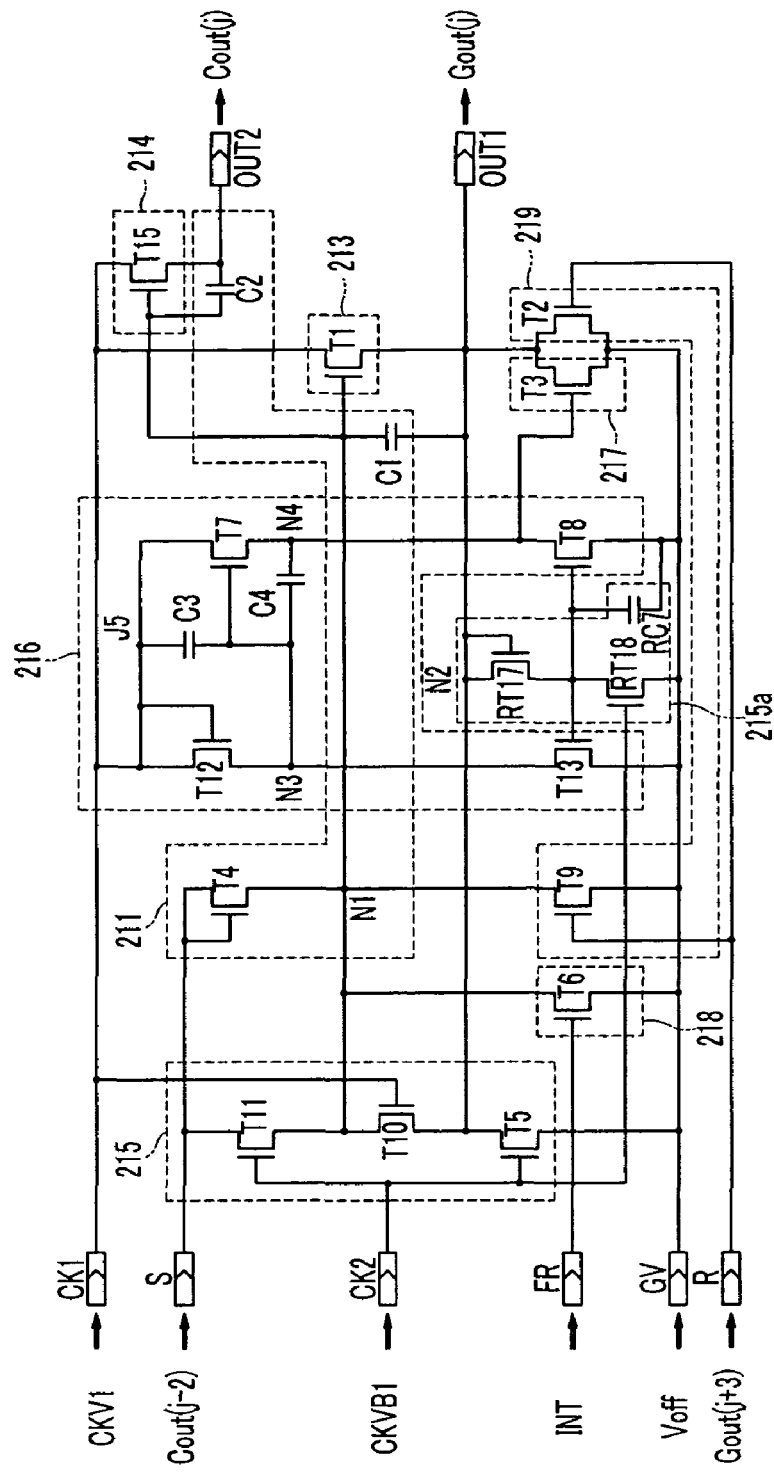
FIG. 3 shows the circuit diagram of each stage of the shift register shown in FIG. 2.
Figure 4:
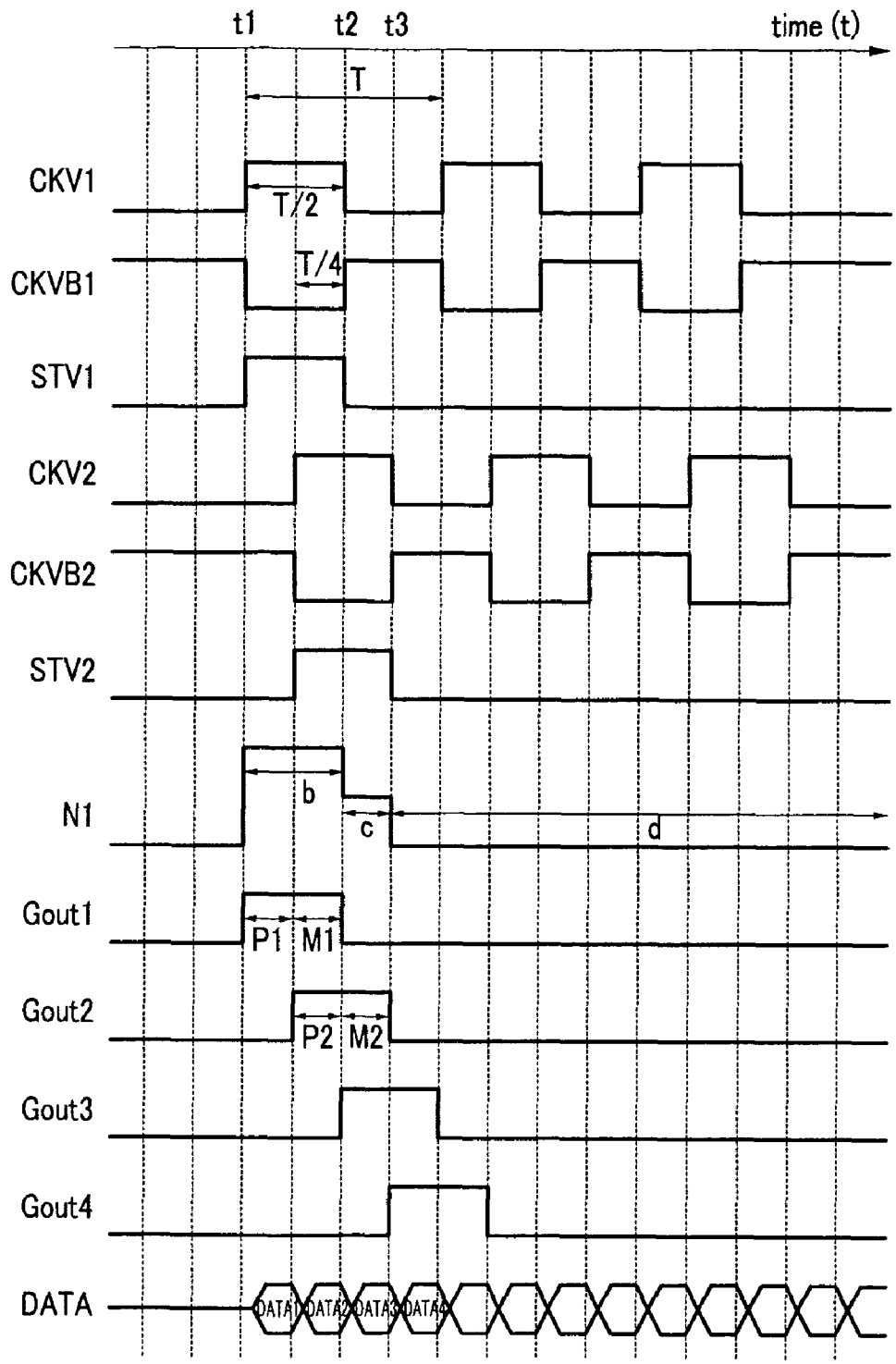
FIG. 4 shows a waveform diagram of operations of respective stages in FIG. 3.

Firstly, referring to FIG. 2 to FIG. 4, a shift register used for the gate driving circuit according to the first exemplary embodiment of the present invention is described.

FIG. 2 shows a block diagram of a first shift register and a second shift register used in a gate driving circuit according to a first exemplary embodiment of the present invention. FIG. 3 is circuit diagram of each stage of a shift register in FIG. 2, and FIG. 4 shows a waveform timing operations of respective stages in FIG. 3.

Referring to FIG. 2, the first shift register 400L is coupled to one terminal of a plurality of gate lines (G1-Gn), and the second shift register 400R is coupled to the other terminals of the gate lines (G1-Gn). In this instance, the second shift register 400R is simultaneously turned on together with the first shift register 400L so that the gate on signals (Gout1, . . . , Gout(j)) respectively output by the first and second shift registers 400L and 400R are simultaneously provided to the corresponding gate lines.

The first shift register 400L includes a plurality of left stages (STL1, . . . , STL(j)) for sequentially outputting the gate on signals (Gout1, . . . , Gout(j)), and the second shift register 400R includes a plurality of right stages (STR1, . . . , STR(j)) for sequentially outputting the gate on signals (Gout1, . . . , Gout(j)). In this instance, the left odd stages (STL1, STL3, STL5) are dependently coupled with each other, and the left even stages (STL2, STL4, STL6) are dependently coupled with each other. Also, the right odd stages (STR1, STR3, STR5) are dependently coupled with each other, and the right even stages (STR2, STR4, STR6) are dependently coupled with each other.

Here, as shown in FIG. 4, the gate on signal (Gout1) applied to the first gate line (G1) includes a preliminary charging period P1 and a main charging period (M1), and the gate on signal (Gout2) applied to the second gate line (G2) is delayed by the preliminary charging period P1.

The first and second shift registers 400L and 400R have the same configuration. Therefore, only the first shift register 400L will be described and the second shift register 400R will not be described.

A plurality of left stages (STL1, . . . , STL(j)) includes a first clock signal terminal (CK1), a second clock signal terminal (CK2), a set terminal (S), a reset terminal (R), an off voltage terminal (GV), a frame reset terminal (FR), a gate output terminal (OUT1), and a carry output terminal (OUT2).

As shown in FIG. 2 and FIG. 4, a first clock signal (CKV1), a first inversion clock signal (CKVB1), a first start signal (STV1), and a gate off signal (Voff) are provided to the left odd stages (STL1, STL3, STL5), and a second clock signal (CKV2), a second inversion clock signal (CKVB2), a second start signal (STV2), and a gate off signal (Voff) are provided to the left even stages (STL2, STL4, STL6).

Here, the first inversion clock signal (CKVB1) has an opposite phase of the first clock signal (CKV1), and the second inversion clock signal (CKVB2) has an opposite phase of the second clock signal (CKV2). Also, the second clock signal (CKV2) is delayed by a T/4 period of one period T of the first clock signal (CKV1), and the first inversion clock signal (CKVB1) is delayed by a T/4 period of one period T of the second inversion clock signal (CKVB2).

Further, the first start signal (STV1) other than the previous carry signal is input to the set terminal (S) of the left stage (STL1), and the second start signal (STV2) is input to the set terminal (S) of the left stage (STL2). In this instance, the second start signal (STV2) is delayed by a T/4 period of the first start signal (STV1).

The first start signal (STV1) other than the next gate on signal is input to the reset terminal (R) of the last stage (STL(j)).

For example, regarding the respective stages (STL1, . . . , STL(j)), the carry signal of the previous stage (STL1) and the gate on signal (Gout6) of the next stage (STL6) are input to the set terminal (S) and reset terminal (R) of the left third stage (STL3), the first inversion clock signal (CKVB1) and the first clock signal (CKV1) are input to the first clock signal terminal (CK1) and the second clock signal terminal (CK2), the gate off signal Voff is input to the off voltage terminal (GV), and the initialization signal (INT) is input to the frame reset terminal (FR). The gate output terminal (OUT1) outputs the gate on signal (Gout3), and the carry output terminal (OUT2) outputs the carry signal. The carry signal of the last stage (STL(j)) is an initialization signal and is provided to the respective stages (STL1, . . . , STL(j)). Here, the left and right stages of the first and second shift registers 400L and 400R have the same configuration.

The last stage (STL(j)) and the second(STL(j−1)) and third stages (STL(j−2)) prior to the last one may be used as dummy stages, and in this case, output terminals of the stages (STL(j), STL(j−1), and STL(j−2)) are coupled to the dummy gate lines that are not used for driving the display device or may be coupled to the reset terminals (R) of the previous stages (STL(j−3), STL(j−4), and STL(j−5)). Also, the carry output terminal (OUT2) that is second to the last stage may be provided without being connected. The dummy stage is used to provide the signal for sequentially operating the respective stages of the first and second shift registers 400L and 400R.

FIG. 3 shows a circuit diagram of each stage of the shift register.

Referring to FIG. 3, the stage includes a pull-up driver 211, a pull-down unit 219, a pull-up unit 213, a carry output unit 214, a ripple improver 215, an inverter 216, a holder 217, a ripple preventer 215a, and a reset unit 218.

The pull-up driver 211 includes a switch (T4), a first capacitor C1, and a second capacitor C2. A gate and a source of the switch T4 are coupled to the set terminal (S), and a drain is coupled to a first node N1. The first capacitor C1 is coupled between a first node N1 and a second node N2, and the second capacitor C2 is coupled between the first node N1 and the carry output terminal (OUT2). The pull-up driver 211 receives a carry signal from one of the previous stages and turns on the pull-up unit 213.

The pull-down unit 219 receives a gate signal from one of the next stages to discharge the current gate signal to the off voltage Voff, and turns off the pull-up unit 213.

The pull-down unit 219 includes a pull-down switch (T2) having a gate coupled to the reset terminal (R), a source coupled to the off voltage terminal (GV), and a drain coupled to the gate output terminal (OUT1), and a switch (T9) having a gate coupled to the reset terminal (R), a source coupled to the off voltage terminal (GV), and a drain coupled to the first node N1. In this instance, the aspect ratio of the switch (T9) may be set as between 1/20 to 1/10 of the aspect ratio of the switch (T1). Here, the pull-down switch (T2) pulls down the current gate voltage that is pulled up by the first clock signal (CKV) by the off voltage Voff that is supplied through the off voltage terminal (GV) in response to the gate output signal (Gout(j+3)) of the next stage. That is, the pull-down switch (T2) is turned on after the first interval and reduces the current gate voltage to the low state. Also, the switch (T9) reduces the gate terminal voltage of the switch (T1) of the pull-up unit 213 to the off voltage Voff that is supplied through the off voltage terminal (GV) to turn off the switch (T1) in response to the gate output signal (Gout(j+3)) of the next stage.

The pull-up unit 213 includes a pull-up switch (T1) having a gate coupled to the first node N1, a source coupled to the first clock signal terminal (CK1), and a drain coupled to the gate output terminal (OUT1). Here, the drain of the pull-up switch (T1) is the output terminal of the pull-up unit 213. Therefore, the pull-up unit 213 outputs the gate on signal (Gout(j)) that is pulled up by the clock signal (CKV1) that is provided through the first clock signal terminal (CK1) to the gate output terminal (OUT1).

The carry output unit 214 includes a carry switch (T15) having a gate coupled to the first node N1, a source coupled to the first clock signal terminal (CK1), and a drain coupled to the carry output terminal (OUT2). Therefore, the carry output unit 214 outputs the carry signal (Cout(j)) that is pulled up by the clock signal (CKV1) provided by the first clock signal terminal (CK1) to the carry output terminal (OUT2). Further, as another exemplary embodiment, the carry signal may be output by the output terminal of the pull-up unit 213 without using the carry switch (T15).

The ripple improver 215 includes a plurality of switches (T11, T10, T5) coupled in series between the set terminal (S) and the off voltage terminal (GV). The switch (T11) has a gate coupled to the second clock signal terminal (CK2), a source coupled to the set terminal (S), and a drain coupled to the first node N1. The switch (T10) has a gate coupled to the first clock signal terminal (CK1), a source coupled to the second node N2, and a drain coupled to the first node N1. The switch (T5) has a gate coupled to the second clock signal terminal (CK2), a source coupled to the off voltage terminal (GV), and a drain coupled to the second node N2.

The switch (T10) provides a signal of the second node N2 to the first node N1 in response to the first clock signal (CKV1) to thereby prevent the ripple of the gate signal (Gout (j)) output by the gate output terminal (OUT1). The switch (T11) provides the carry signal (Cout(j)) of another stage to the first node N1 in response to the first inversion clock signal (CKVB1) that is provided through the second clock signal terminal (CK2) to thus prevent the ripple of the gate signal (Gout(j)) output by the gate output terminal (OUT1). Also, the switch (T5) provides the gate off signal Voff to the second node N2 in response to the first inversion clock signal (CKVB1) that is provided through the second clock signal terminal (CK2) to thus prevent the ripple of the gate signal (Gout(j)) output by the gate output terminal (OUT1).

The holder 217 has a control terminal coupled to the inverter 216 and includes a switch (T3). The switch (T3) has a gate coupled as a control terminal of the holder 217 to a fourth node (N4) of the inverter 216, a source coupled to the off voltage terminal (GV), and a drain coupled to the gate output terminal (OUT1).

The inverter 216 includes a plurality of switches (T12, T7, T13, and T8) and third and fourth capacitors (C3 and C4), and turns on or turns off the switch (T3) of the holder 217.

A gate and a source of the switch (T12) are coupled to the first clock signal terminal (CK1), and a drain thereof is coupled to the third node (N3). The switch (T7) has a gate coupled to the third node (N3), a source coupled to the first clock signal terminal (CK1), and a drain coupled to the fourth node (N4). The third capacitor (C3) is coupled between the first clock signal terminal (CK1) and the third node (N3), and the fourth capacitor (C4) is coupled between the third node (N3) and the fourth node (N4). Also, each gate of the switches (T13, T8) is coupled to the second node N2 through a ripple preventing diode (RT17), each source is coupled to the off voltage terminal (GV), and each drain is coupled to the third node (N3) and the fourth node (N4).

The switches (T12, T7) are turned on in response to the first clock signal (CKV1) to output the first clock signal (CKV1) to the third and fourth nodes (N3, N4), and in this instance, a high-level gate on signal (Gout(j)) is output through the gate output terminal (OUT1). The switches (T13, T8) are turned on so that the third and fourth nodes (N3, N4) are discharged to the gate off signal Voff. Here, the switch (T3) is maintained to be turned off.

When, a low-level gate on signal (Gout(j)) is output by the gate output terminal (OUT1), the switches (T13, T8) are turned off. In this instance, the switches (T12, T7) are turned on to apply a high-level clock signal (CKV1) to the fourth node (N4), and the switch (T3) of the holder 217 outputs the gate off signal Voff to the gate output terminal (OUT1) in response to the clock signal (CKV1). Therefore, the gate output terminal (OUT1) is held with the gate off signal Voff by the holder 217.

The reset unit 218 is coupled to the pull-up driver 211, and includes a switch (T6) having a gate coupled to the frame reset terminal (FR), a source coupled to the off voltage terminal (GV), and a drain coupled to the first node N1. The switch (T6) discharges the noise that is input through the set terminal (S) as the gate off signal Voff in response to the carry signal (Cout(j)) of the last stage.

Therefore, the second node N2 resets the output terminals (OUT1, OUT2) by outputting the gate off signal Voff and turning off the switches (T1, T15).

The ripple preventer 215a has a ripple preventing diode (RT17) coupled to gates of the switches (T8, T13) of the inverter 216 and a ripple preventing switch (TR18). The ripple preventing diode (RT17) has a drain coupled to a drain of the ripple preventing switch (RT18) and a source and a gate coupled in common to the second node N2. The ripple preventing switch (RT18) has a gate coupled to the second clock signal terminal (CK2) and a source coupled to the off voltage terminal (GV). Also, a ripple preventing capacitor (RC7) is coupled between a gate and a source of the switch (T8) of the inverter 216.

Here, when a ripple is applied to the second node N2 through the gate output terminal (OUT1), the ripple preventing diode (RT17) weakens the ripple voltage by a threshold voltage of the ripple preventing diode (RT17) to thus reduce the ripple voltage influence provided to the input terminals (gates of T8 and T13) of the inverter 216. Also, the ripple preventing switch (RT18) is operated by the first inversion clock signal (CKVB1) having the opposite polarity of the first clock signal (CKV1) that is an input signal of the gate on signal, to reset the input terminals (gates of T8 and T13) of the inverter 216 to the gate off signal Voff and thereby eliminate the ripple influence. Also, the ripple preventing capacitor (RC7) is coupled between the gate and the source of the switch (T8) of the inverter 216 to absorb the ripple voltage that is applied to the input terminals (gates of T8 and T13) of the inverter 216.

Accordingly, when the voltage at the gate output terminal (OUT1) caused by a parasitic capacitor coupled to a plurality of gate lines is varied, the abnormal outputs by the inverter 216 and the holder 217 can be improved by the ripple preventing diode (RT17), the ripple preventing switch (RT18), and the ripple preventing capacitor (RC7). Also, the signal variation of the current gate voltage can be reduced by improving the bad outputs of the inverter 216 and the holder 217. Further, since the current gate (OUT) signal is transmitted to the next stage as the carry signal, reliability of the gate driving circuits of the entire stages can be acquired and the image quality is improved.

Referring to FIG. 3 and FIG. 4, operations of the respective stages are described as follows.

Referring to FIG. 3 and FIG. 4, when the switch (T4) is turned on in response to the first start signal (STV1) or another stage's carry signal at the time t1, the first and second capacitors (C1, C2) are charged. At the same time, a high-level first clock signal (CKV1) is applied to the first clock signal terminal (CK1) so that the switch (T1) of the pull-up unit 213 and the switch (T15) of the carry output unit 214 are turned on. Therefore, the high-level of the first clock signal (CKV1) provided to the first clock signal terminal (CK1) is respectively output to be a gate on signal (Gout(j)) and a carry signal (Cout(j)) through the gate output terminal (OUT1) and the carry output terminal (OUT2). In this instance, the first node N1 has a first voltage level in the gate enable period (b), the switch (T1) is turned on, and the gate enable period (b) is maintained during 2H.

At the time t2, the switch (T1) is maintained to be turned on and the clock signal (CKV1) provided to the first clock signal terminal (CK1) is output as the gate off signal (Gout(j)) through the gate output terminal (OUT1). In this instance, the first node N1 has a second voltage level less than the first voltage level in the first gate disable period (c), and the first gate disable period (c) is maintained during 1H. Here, the first gate disable period (c) represents a period until another stage's gate on signal (Gout(j+3)) is input to the gate of the switch (T9).

At the time t3, when the switch (T9) is turned on in response to another stage's gate on signal (Gout(j+3)), the first node N1 is discharged to a third voltage level, that is, the gate off signal Voff, which is less than the second voltage level during the second gate disable period (d). In this instance, the charges charged in the first and second capacitors (C1, C2) are discharged to be the gate off signal Voff through the switch (T9).

The switch (T2) pulls the voltage level of the second node down to the voltage level of the gate off signal. When another stage's gate on signal (Gout(j+3)) is provided to the reset terminal (R) of each stage, the first node is controlled to have the voltage of the gate off signal Voff during the second gate disable period and thereby turn off the switch (T1), and the switch (T2) is turned on to output the gate off signal Voff to the second node. As another exemplary embodiment, the switch (T9) may function as the switch (T2) when the switch (T2) is not provided. Therefore, the space occupied by the gate driving circuit can be reduced in the liquid crystal panel by eliminating the switch (T2) that occupies the largest space on the gate driving circuit, and hence, the process margin of the gate driving circuit can be acquired.

Figure 5:
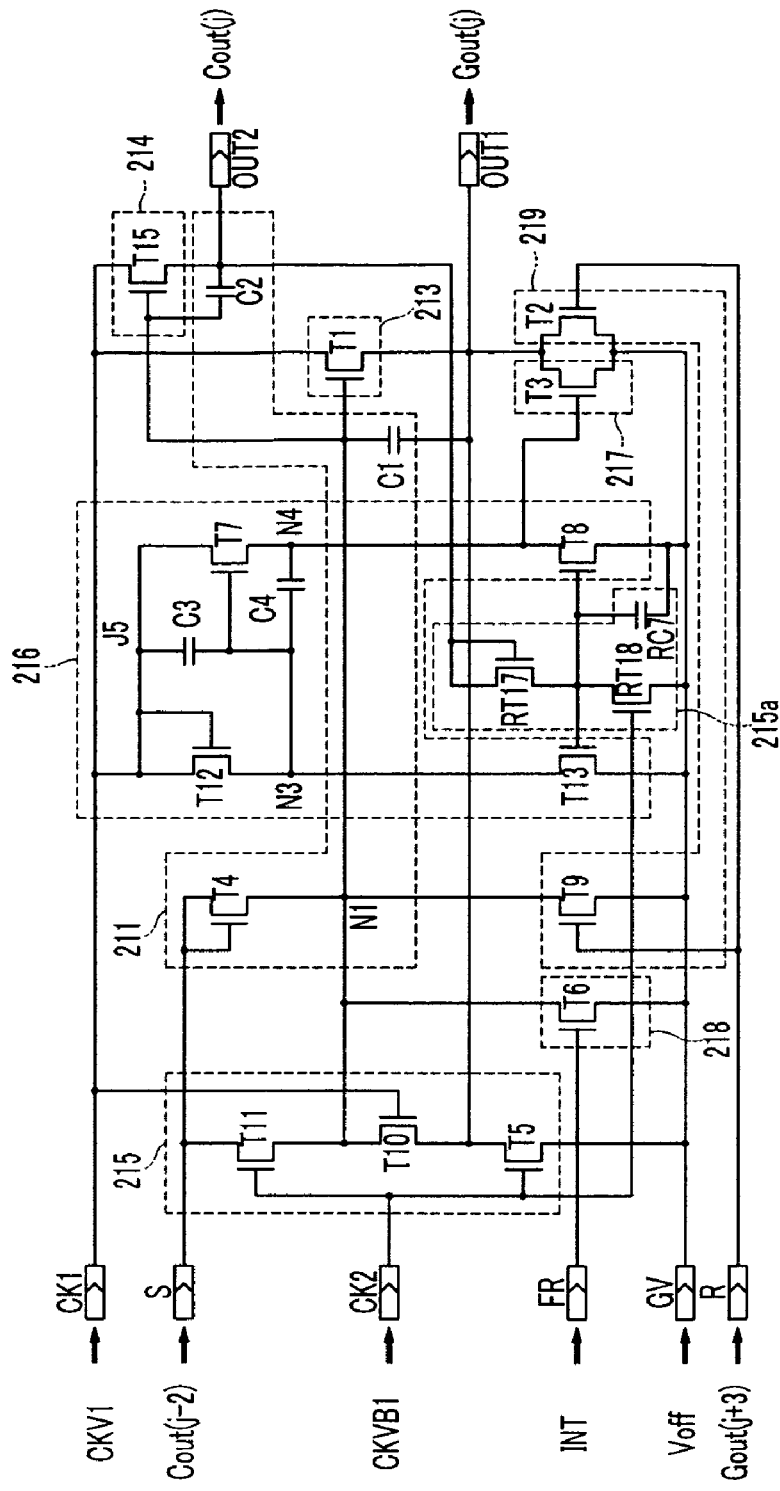
FIG. 5 shows the circuit diagram of each stage of a shift register according to a second exemplary embodiment of the present invention.

FIG. 5 shows the circuit diagram of each stage of a shift register according to a second exemplary embodiment of the present invention.

The stage includes a pull-up driver 211, a pull-down unit 219, a pull-up unit 213, a carry output unit 214, a ripple improver 215, an inverter 216, a holder 217, a ripple preventer 215a, and a reset unit 218.

In the second exemplary embodiment of the present invention, the elements other than the ripple preventer 215a and the carry output unit 214 correspond to those of the first exemplary embodiment of the present invention and a description thereof is unnecessary.

A source and a gate of the ripple preventing diode (RT17) of the ripple preventer 215a may be coupled in common to an output terminal of the carry output unit 214. Since an output terminal of the carry output unit 214 is not directly coupled to the gate line, the ripple voltage caused by the change of the gate signal is prevented from influencing the inverter 216. However, since the carry output unit 214 may generate a ripple voltage, the ripple preventer 215a is provided to prevent the ripple voltage from influencing the inverter 216e.

The configuration of another circuit of the ripple preventer 215a corresponds to that of the first exemplary embodiment. The second exemplary embodiment of the present invention can acquire the same effect as the first exemplary embodiment of the present invention.

Figure 6:
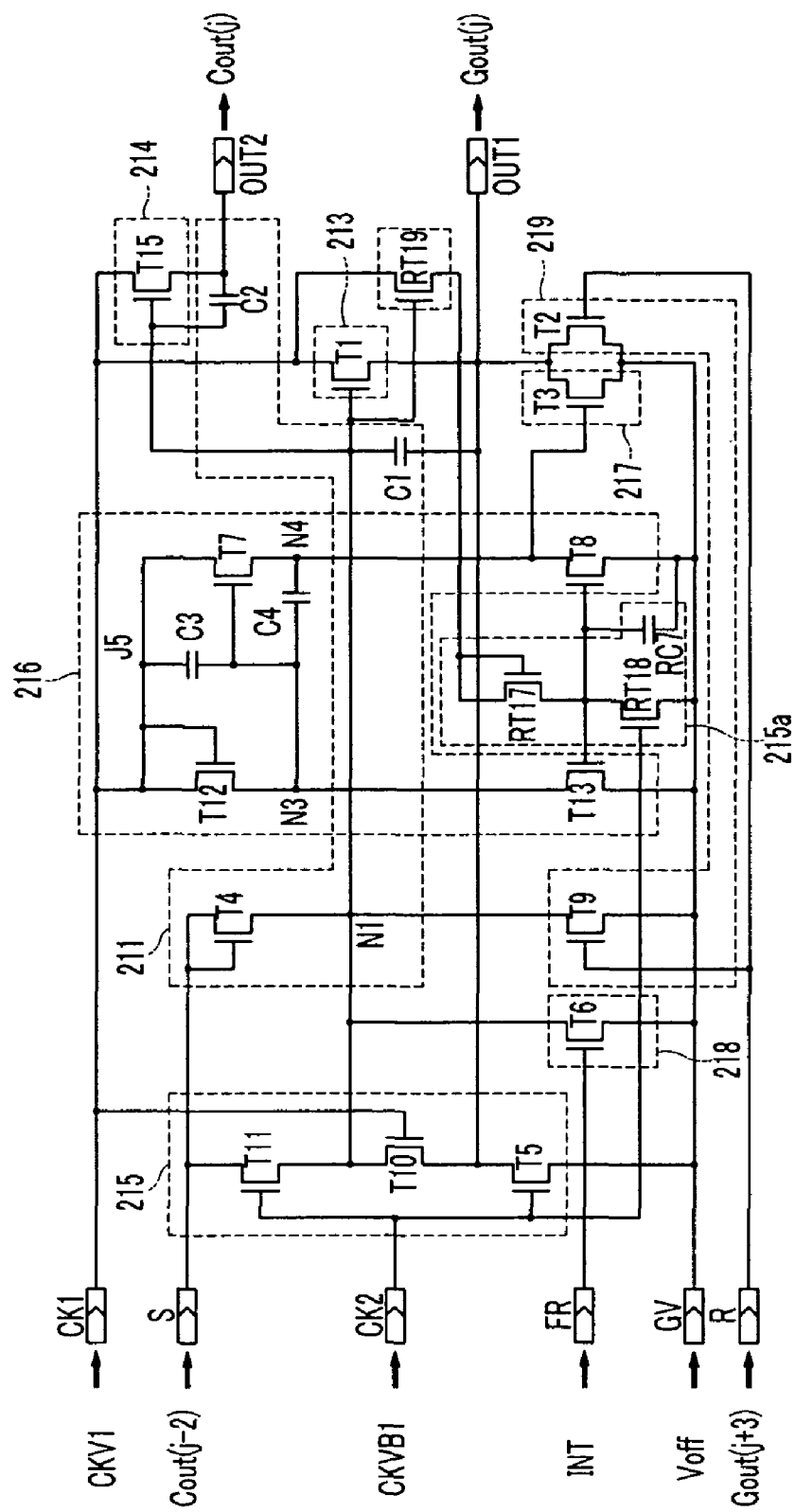
FIG. 6 shows the circuit diagram of each stage of a shift register according to a third exemplary embodiment of the present invention.

FIG. 6 is the circuit diagram of each stage of a shift register according to a third exemplary embodiment of the present invention.

The stage includes a pull-up driver 211, a pull-down unit 219, a pull-up unit 213, a second pull-up unit (RT19), a carry output unit 214, a ripple improver 215, an inverter 216, a holder 217, a ripple preventer 215a, and a reset unit 218.

In the third exemplary embodiment of the present invention, the elements other than the ripple preventer 215a and the second pull-up unit (RT19) correspond to those of the first exemplary embodiment of the present invention, and a description thereof is not required.

A source and a gate of the ripple preventing diode (RT17) of the ripple preventer 215a may be coupled in common to an output terminal of the second pull-up unit (RT19). The second pull-up unit (RT19) includes a gate and a source respectively coupled to a gate and a source of the pull-up unit 213, and a drain coupled to the ripple preventing diode. Since the second pull-up unit (RT19) is further included in the third embodiment of the present invention, the signal distorted by the change of the gate signal is prevented from being input to the ripple preventer 215a. However, since the second pull-up unit (RT19) may generate a ripple voltage, the ripple preventer 215a is provided to prevent the ripple voltage from influencing the inverter 216.

The configuration of another circuit of the ripple preventer 215a corresponds to that of the first exemplary embodiment. The third exemplary embodiment of the present invention acquires the same effect as the first exemplary embodiment of the present invention.

The gate driving circuit and the display device including the same according to the exemplary embodiment of the present invention adds at least one of the diode, transistor, and capacitor to the ripple preventer of the inverter so as to prevent the inverter's bad drive caused by the ripple of the gate voltage in each stage, and hence the influence provided to the inverted by the gate voltage's ripple is reduced by the threshold voltage of the diode.

Therefore, the input electrode and the gate electrode of the ripple preventing diode is coupled in common to the gate line, and the output electrode is coupled to the transistor of the inverter. Particularly, the reliability of the gate driving circuit against the ripple of the gate signal generated under the high temperature condition can further be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A gate driving circuit including a plurality of dependently coupled stages, wherein one or more of the stages comprises:
   a pull-up unit for pulling up a current gate signal in response to a first clock signal during a first period in one frame;
   a pull-up driver coupled to the pull-up unit, the pull-up driver receiving a carry signal from one of a previous stage and turning on the pull-up unit;
   a pull down unit for receiving a gate signal from a next stage, the pull down unit discharging the current gate signal to an off voltage level, and turning off the pull-up unit;
   a holder for holding the current gate signal at the off voltage level;
   an inverter for turning on or turning off the holder in response to the first clock signal; and
   a ripple preventer having an output terminal coupled to an input terminal of the inverter and preventing noise from transmitting to the inverter;
   wherein the ripple preventer comprises a ripple preventing diode comprised of a transistor having a source terminal and a gate terminal both directly connected to an output terminal of the pull-up unit, and a drain terminal coupled to an input terminal of the inverter.

2. The gate driving circuit of claim 1, wherein the ripple preventer further comprises;
   a ripple preventing transistor having a drain terminal coupled to the drain terminal of the ripple preventing diode, a source terminal coupled to an off voltage terminal for applying the off voltage, and a gate terminal coupled to a second clock signal terminal for applying a second clock signal having an opposite phase of the first clock signal.

3. The gate driving circuit of claim 2, wherein
   the pull-up unit comprises a first pull-up unit and an output terminal of the first pull-up unit is coupled to the current gate line.

4. The gate driving circuit of claim 3, wherein
   an output terminal of the first pull-up unit is coupled to the source terminal and the gate terminal of the ripple preventing diode.

5. The gate driving circuit of claim 3, further comprises a carry circuit for pulling up a current carry signal by using the first clock signal during the first period and an output terminal of the carry circuit is coupled to the pull-up driver of a next stage.

6. The gate driving circuit of claim 1, wherein
   the inverter further includes:
   a first inverter transistor having a drain terminal coupled to a first clock signal terminal for applying the first clock signal, a source terminal coupled to the off voltage terminal, and a gate terminal coupled to the drain terminal of the ripple preventing diode;
   a second inverter transistor having a gate terminal coupled to the drain terminal of the ripple preventing diode, a source terminal coupled to the off voltage terminal, and a drain terminal coupled to a control terminal of the holder; and
   a ripple preventing capacitor coupled between the gate terminal and the source terminal of the second inverter transistor.

7. A display device comprising:
   a display unit for displaying an image in response to a gate signal and a data signal;
   a data driver for providing the data signal to the display unit; and
   a gate driving circuit including a plurality of dependently coupled stages and sequentially outputting the gate signal to the display unit, wherein
   the stage of the gate driving circuit includes
   a pull-up unit for pulling up a current gate signal in response to a first clock signal during a first period in one frame;
   a pull-up driver coupled to the pull-up unit; the pull-up driver receiving a carry signal from one of a previous stage and turning on the pull-up unit;
   a pull down unit for receiving a gate signal from a next stage, the pull down unit discharging the current gate signal to an off voltage level, and turning off the pull-up unit;
   a holder for holding the current gate signal at the off voltage level;
   an inverter for turning on or turning off the holder in response to the first clock signal; and
   a ripple preventer having an output terminal coupled to the inverter and preventing noise from transmitting to the inverter;
   wherein the ripple preventer comprises a ripple preventing diode comprised of a transistor having a source terminal and a gate terminal both directly connected to an output terminal of the pull-up unit, and a drain terminal coupled to an input terminal of the inverter.

8. The display device of claim 7, wherein the ripple preventer further comprises;
   a ripple preventing transistor having a drain terminal coupled to the drain terminal of the ripple preventing diode, a source terminal coupled to an off voltage terminal for applying the off voltage, and a gate terminal coupled to a second clock signal terminal for applying a second clock signal having an opposite phase of the first clock signal.

9. The display device of claim 8, wherein
   the pull-up unit comprises a first pull-up unit and an output terminal of the first pull-up unit is coupled to the current gate line.

10. The display device of claim 9, wherein
    an output terminal of the first pull-up unit is coupled to the source terminal and the gate terminal of the ripple preventing diode.

11. The display device of claim 9, further comprises a carry circuit for pulling up a current carry signal by using the first clock signal during the first period and an output terminal of the carry circuit is coupled to the pull-up driver of one of next stages.

12. The display device of claim 7, wherein the inverter further includes:
    a first inverter transistor having a drain terminal coupled to a first clock signal terminal for applying the first clock signal, a source terminal coupled to the off voltage terminal, and a gate terminal coupled to the drain terminal of the ripple preventing diode;

a second inverter transistor having a gate terminal coupled to the drain terminal of the ripple preventing diode, a source terminal coupled to the off voltage terminal, and a drain terminal coupled to a control terminal of the holder; and a ripple preventing capacitor coupled between the gate terminal and the source terminal of the second inverter transistor.

* * * * *